US006774634B2

(12) United States Patent
Cosman

(10) Patent No.: US 6,774,634 B2
(45) Date of Patent: Aug. 10, 2004

(54) AUTOMATED NMR ANALYSIS USING SOLVENTS AND SAMPLE TUBE MATERIALS TO CONTROL FREQUENCY SHIFTS

(75) Inventor: Jason W. Cosman, Sunnyvale, CA (US)

(73) Assignee: Varian, Inc., Palo Alto, CA (US)

(*) Notice: Subject to any disclaimer, the term of this patent is extended or adjusted under 35 U.S.C. 154(b) by 298 days.

(21) Appl. No.: 10/061,027

(22) Filed: Jan. 29, 2002

(65) Prior Publication Data

US 2003/0156986 A1 Aug. 21, 2003

(51) Int. Cl.[7] .............................................. G01V 3/00
(52) U.S. Cl. ...................................... 324/321; 324/309
(58) Field of Search ................................ 324/321, 309, 324/318, 307, 306, 322, 316; 422/82.05

(56) References Cited

U.S. PATENT DOCUMENTS

| | | | |
|---|---|---|---|
| 4,654,592 A | * | 3/1987 | Zens .......................... 324/307 |
| 4,916,398 A | | 4/1990 | Rath |
| 4,950,993 A | | 8/1990 | Encellaz et al. |
| 5,036,426 A | | 7/1991 | Shen |
| 5,081,418 A | | 1/1992 | Hayes et al. |
| 5,552,709 A | | 9/1996 | Anderson |
| 5,552,710 A | | 9/1996 | Busse-Grawitz et al. |
| 5,598,097 A | * | 1/1997 | Scholes et al. .............. 324/316 |
| 5,986,455 A | | 11/1999 | Magnuson |
| 6,204,665 B1 | | 3/2001 | Triebe et al. |
| 6,310,480 B1 | * | 10/2001 | Cohen et al. ................ 324/321 |
| 6,323,647 B1 | | 11/2001 | Anderson et al. |
| 6,614,228 B2 | * | 9/2003 | Hofmann et al. ........... 324/321 |
| 2002/0130661 A1 | * | 9/2002 | Raftery et al. .............. 324/318 |
| 2003/0156986 A1 | * | 8/2003 | Cosman ................... 422/82.05 |

FOREIGN PATENT DOCUMENTS

EP     1331488 A2  *  7/2003  ........... G01R/33/30

\* cited by examiner

*Primary Examiner*—Diego Gutierrez
*Assistant Examiner*—Tiffany A. Fetzner
(74) *Attorney, Agent, or Firm*—Andrei Popovici; Bella Fishman

(57) ABSTRACT

Test tubes with different dielectric properties are used for holding different samples/solvents within a nuclear magnetic resonance (NMR) probe of an NMR spectrometer. The test tube dielectric properties are chosen such that the overall capacitance seen by the NMR probe coils remains constant as different samples and test tubes are inserted into the probe. Samples having different solvents introduce substantially equal frequency shifts into the measurement circuitry. The disclosed systems and methods facilitate automated NMR measurements, and do not require specialized electronic or moving mechanical components for tuning compensation.

48 Claims, 4 Drawing Sheets

AUTOMATED NMR ANALYSIS USING SOLVENTS AND SAMPLE TUBE MATERIALS TO CONTROL FREQUENCY SHIFTS

FIELD OF THE INVENTION

The invention in general relates to nuclear magnetic resonance (NMR) spectroscopy, and in particular to systems and methods for resonant frequency tuning compensation for NMR.

BACKGROUND OF THE INVENTION

Nuclear magnetic resonance (NMR) spectrometers typically include a superconducting magnet for generating a static magnetic field $B_0$, and one or more special-purpose radio-frequency (RF) coils for generating a time-varying magnetic field $B_1$ perpendicular to the field $B_0$, and for detecting the response of a sample to the applied magnetic fields. Each RF coil and associated circuitry can resonate at the Larmor frequency of a nucleus of interest present in the sample. The RF coils are typically provided as part of an NMR probe, and are used to analyze samples situated in sample tubes or flow cells. The direction of the static magnetic field $B_0$ is commonly denoted as the z-axis, while the plane perpendicular to the z-axis is commonly termed the x-y or θ-plane.

The frequency of interest is determined by the nucleus of interest and the strength of the applied static magnetic field $B_0$. In order to maximize the accuracy of NMR measurements, the resonant frequency of the excitation/detection circuitry is set to be equal to the frequency of interest. The resonant frequency of the excitation/detection circuitry is generally $$v = \sqrt{LC} \qquad [1]$$

where L and C are the effective inductance and capacitance, respectively, of the excitation/detection circuitry.

Additionally, in order to maximize the transfer of RF energy into the RF coils, the impedance of each coil is matched to the impedance of the transmission line and associated components used to couple RF energy into the coil. If the coil is not impedance-matched, a sub-optimal fraction of the RF energy sent to the coil actually enters the coil. The rest of the energy is reflected out, and does not contribute to the NMR measurements.

Several approaches have been proposed for adjusting the circuitry of NMR spectrometers to achieve desired resonance frequency tuning or impedance matching. For example, in U.S. Pat. No. 6,204,665, Triebe et al. describe an NMR probe including movable adjustment rods for tuning the resonant frequency of the probe resonator. The probe also includes an actuator for performing remotely-controlled adjustments of electrical and or mechanical units such as variable resistors, inductors, and trimmer capacitors. In U.S. Pat. No. 5,986,455, Magnuson describes a tuning apparatus including a plurality of capacitors which can be switched into a tuning circuit by controllable switches. In U.S. Pat. No. 5,081,418, Hayes et al. describe a method of tuning a radio-frequency coil by connecting sections of the coil to ground.

Conventional resonance frequency tuning methods often involve relatively complex components and circuitry that must be adjusted. The adjustment steps can be relatively time-consuming and can require operator intervention for controlling the compensation.

SUMMARY OF THE INVENTION

The present invention provides systems and methods for performing tuning-compensated nuclear magnetic resonance measurements by appropriately tailoring the properties of different solvents and sample tubes such that samples comprising different solvents introduce substantially equal frequency shifts into the resonant circuit(s) employed for the measurements. Appropriate choices of sample tube-solvent pairs reduce or eliminate the need for externally adjusting the external circuitry of the spectrometer between measurements.

BRIEF DESCRIPTION OF THE DRAWINGS

The foregoing aspects and advantages of the present invention will become better understood upon reading the following detailed description and upon reference to the drawings where.

DETAILED DESCRIPTION OF THE INVENTION

In the following description, unless explicitly specified otherwise, the term "dielectric constant" is understood to encompass the effective dielectric constant of structures (e.g. sample tubes) formed from more than one material or composition. The effective dielectric constant of a multi-layer or multi-component sample tube is the dielectric constant of a standard uniform cylindrical sample tube having the same dielectric properties as the multi-layer or multi-component sample tube. Dielectric constants referred to below are relative dielectric constants. Unless otherwise stated explicitly, the term "sample" is used to encompass a sample tube and contents of the sample tube, including solvent(s), compound(s) of interest containing the nuclei of interest on which NMR measurements are to be performed, and any other compounds contained in the sample tube. The term "sample tube" is not limited to cylindrically-shaped containers. It is understood that any recited first and second elements (e.g. first and second compounds of interest) may have identical or different properties, unless explicitly specified otherwise. Determining a sample tube parameter such as effective dielectric constant or corresponding frequency shift is understood to encompass measuring the parameter, computing the parameter, or retrieving a pre-measured or pre-computed value of the parameter.

The following description illustrates embodiments of the invention by way of example and not necessarily by way of limitation.

Figure 1:
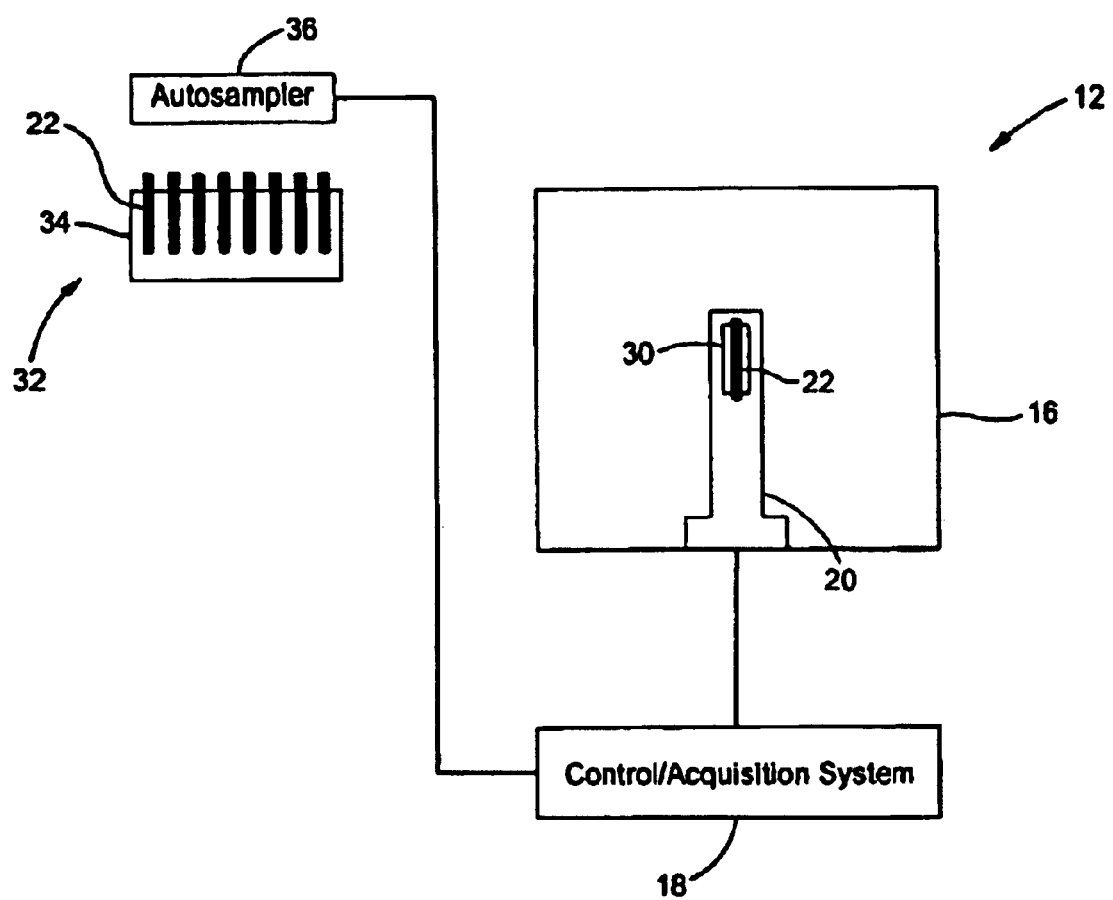
FIG. 1 is a schematic diagram of an NMR spectrometer suitable for use in a method of the present invention.

FIG. 1 is a schematic diagram illustrating a nuclear magnetic resonance (NMR) spectrometer 12. Spectrometer 12 comprises a magnet 16, an NMR probe 20 inserted in a bore of magnet 16, a control/acquisition system 18 electrically connected to magnet 16 and probe 20, and a sample holding/delivery system 32 coupled to probe 20 and control/ acquisition system 18. Probe 20 holds one NMR sample of interest 22 at a time within the bore of magnet 16, as NMR measurements are performed on the sample. Magnet 16 applies a static longitudinal magnetic field $B_0$ to each sample. Sample holding delivery/system 32 holds a plurality of samples to be loaded into probe 20, and loads the samples into and out of probe 20. Control/acquisition system 18 applies desired radio-frequency pulses to probe 20, controls the temperature of probe 20 and the operation of sample holding/delivery system 32, and acquires data indicative of the nuclear magnetic resonance properties of the samples within probe 20.

Probe 20 includes one or more radio-frequency (RF) resonators (coils) 30 for applying radio-frequency magnetic fields $B_1$ to the samples of interest, and/or for measuring the response of the samples to the applied magnetic fields. Each RF coil 30 is electromagnetically coupled to the sample of interest, and is electrically connected to control/acquisition system 18. Each coil 30 is part of an NMR measurement resonant circuit defined by coil 30, the sample 22 coupled to coil 30, and the external measurement circuitry connected to coil 30. In practice, the resonant frequency of the resonant circuit is defined primarily by the properties of coil 30, but depends also on the properties of sample 22 and the circuitry connected to coil 30. The resonant frequency of the resonant circuit is preferably equal to the Larmor frequency of the nucleus of interest. The Larmor frequency of each nucleus is proportional to the magnetic moment of the nucleus and the strength of the static magnetic field $B_0$ applied by magnet 16.

Sample holding/delivery system 32 includes a multi-sample holder 34 for holding plural samples 22, and a conventional autosampler system 36 including a robotic arm and associated components for sequentially transferring samples 22 from sample holder 34 into probe 20. Holder 34 holds a plurality of samples 22 (e.g. 96 samples) having different solvents and sample tube properties tailored to achieve desired tuning compensation, as described in detail below. Holder 34 is preferably a conventional rack having multiple openings for holding samples 22.

Each sample 22 includes a cylindrical sample tube and the contents of the sample tube. The sample tube is sized to fit tightly within the RF coil(s) 30 of probe 20.

Each sample tube contains a compound of interest and a solvent suitable for holding the compound of interest in solution. The compound of interest includes the nucleus or nuclei of interest on which NMR measurements are to be performed. Examples of typical nuclei of interest targeted in NMR measurements include $^1H$, $^{13}C$, $^{15}N$, and $^{19}F$. Preferably, the sample tube is formed of materials that do not affect the NMR measurements to be performed on the sample of interest. Sample tube materials suitable for use in the present invention include, without limitation, quartz, borosilicate glasses (one of which is commonly known under the trade name Pyrex®, a trademark of Corning Corporation), other glasses, plastics, crystalline materials, and ceramics such as barium titanate, bariam titanate, and lead magnesium niobate. Such materials may be used alone or in combinations or stacks (e.g. as coatings), as described in further detail below.

Figure 2:
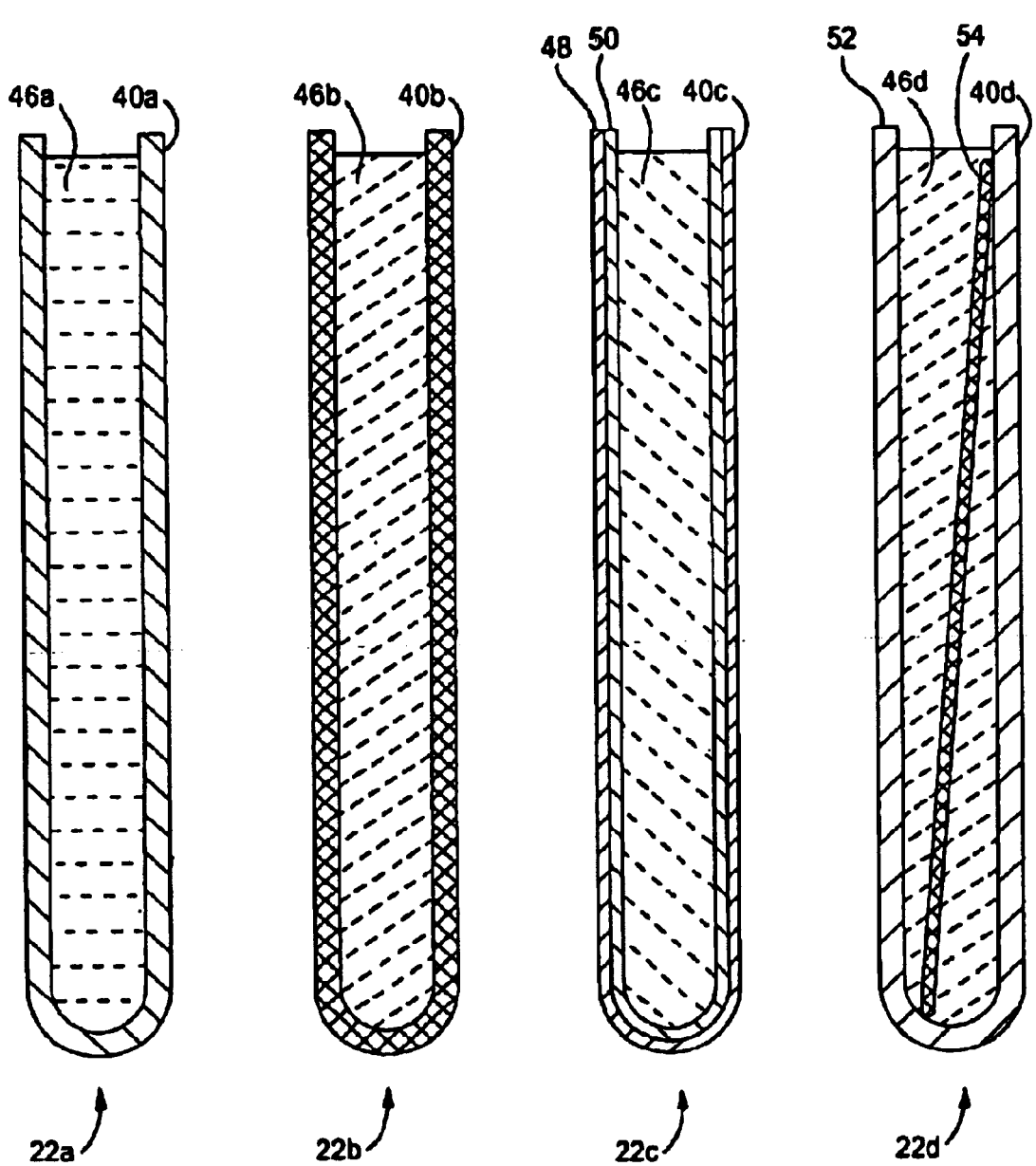
FIGS. 2-A through 2-D show a set of four sample tubes having substantially identical dielectric properties, suitable for use in a method of the present invention.

FIGS. 2-A through 2-D show side views of four samples 22*a–d* suitable for use in a method of the present invention. Samples 22*a–d* comprise cylindrical sample tubes 40*a–d* and corresponding sample tube contents 46*a–d* contained within sample tubes 40*a–d*. Sample contents 46*a–d* include different solvents and compounds of interest, as explained in further detail below. Preferably, the external and internal dimensions of samples 22*a–d* are identical.

It is often desirable to use solvents that are tailored to the properties of the particular compound of interest. For example, organic, non-polar solvents are typically used with organic samples, while polar solvents are used with ionic or polar samples. Common apolar solvents include benzene, hexane, toluene, diethyl ether and chloroform. Common polar solvents include water, acetone, ethanol, methanol, and dimethylsulfoxide (DMSO). Preferably, the solvents are chosen so as not to contain the nucleus or nuclei of interest, on which NMR measurements are to be performed.

Different solvents have different dielectric properties. Solvents with higher dielectric constants are generally more polar than solvents with lower dielectric constants. In the following discussion, solvents with a dielectric constant higher than 10 will be referred to as polar, while solvents with a dielectric constant lower than 10 will be referred to as apolar. Table 1 lists approximate dielectric constants for several common solvents:

TABLE 1

| Apolar solvent | $\epsilon$ | Polar solvent | $\epsilon$ |
| --- | --- | --- | --- |
| hexane | 1.9 | acetone | 20.7 |
| benzene | 2.3 | ethanol | 24.3 |
| toluene | 2.4 | methanol | 33.6 |
| chloroform | 4.8 | DMSO | 48 |
| acetic acid | 6.2 | water | 80 |

The figures in Table 1 are approximate. The dielectric constants of solvents containing other compounds can vary with the identities and quantities of those compounds. For example, the dielectric constant of water can be greatly increased through the addition of salts.

Samples containing different solvents can introduce different frequency shifts in the resonant frequency of a given RF resonant circuit used for NMR measurements. As a result, the resonant frequency of the circuit may become mistuned relative to the Larmor frequency of the nucleus of interest. Such mistuning can cause unacceptable changes in PW90, the RF pulse width required to achieve a 90° flip of the nucleus of interest. Large changes in PW90 reduce the sensitivity of the NMR measurements, and can render the measurements useless.

As discussed above in the Background section, the prior art discloses a variety of approaches for tuning the resonant frequency of the resonant circuits of NMR spectrometers. Conventional tuning approaches involve changing the part of the NMR circuit that is external to the sample. Such approaches require the active retuning of the external circuitry when samples with different dielectric properties are inserted into the NMR probe. Such retuning can be particularly difficult and time-consuming if large numbers (e.g. hundreds) of samples are automatically analyzed in a batch.

In the preferred embodiment of the present invention, the detuning introduced by the use of different solvents is compensated for through the use of sample tubes having appropriate dielectric properties selected to compensate for the solvent detuning. Solvents are matched with corresponding sample tubes such that each sample introduces substantially the same frequency shift in the resonant frequency of the resonant circuits used for NMR measurements. Tuning compensation is performed essentially by appropriate selection of solvents and sample tubes. The composition and/or geometry of the sample tube itself is used for tuning the resonant frequency of the measurement circuit. Such tuning compensation can be performed before measurements are run on a batch of samples. The appropriately-tailored samples are simply loaded into a sample holder, and inserted one by one into the NMR probe. The tuning compensation achieved through the use of appropriate solvent/sample tube pairs reduces the need for potentially cumbersome and time-consuming tuning of the circuitry external to the samples between measurements.

It has been observed that, in practice, the frequency detuning introduced by samples is determined primarily by the dielectric properties of the samples. Consequently, duplicating the detuning effects of different samples can be achieved by duplicating the effective dielectric properties of the different samples. To duplicate the dielectric properties of different samples, solvents having relatively high dielectric constants are used with sample tubes having relatively low dielectric constants, while solvents having relatively low dielectric constants are used with sample tubes having relatively high dielectric constants.

Various sample tube materials and geometries may be employed to achieve tuning compensation. Several such geometries are illustrated in FIGS. 2-A through 2-D.

FIG. 2-A shows a first sample 22a comprising a cylindrical, monolithic sample tube 40a and associated sample tube contents 46a. Sample tube contents 46a include a first solvent and a compound of interest. Sample tube 40a is formed by a single, integrally formed, uniform piece of a first sample tube material. The first solvent and the first sample tube material are dielectric materials that do not interfere with performing NMR measurements on the first sample.

Preferably, the material used for sample tube 40a is low-loss, i.e. it does not dissipate large amounts of energy, so as to maximize the energy that reaches the sample tube contents. It is also preferred that sample tube 40a be chemically and mechanically resistant. Using a single, homogeneous sample tube material for sample tube 40a can allow improved lineshapes. Nevertheless, non-homogeneous, composite sample tubes formed of different materials may be used in the present invention, as described below with reference to FIGS. 2-C and 2-D.

Presently preferred materials for sample tubes such as sample tube 40a include quartz, sapphire, glasses (such as Pyrex®, a borosilicate glass), plastics or polymers (such as polytetrafluoroethylene, known under the trade name Teflon®, crystalline compounds, and ceramics such as barium titanate, bariam titanate, and lead magnesium niobate. The choice of material will depend in general on the material characteristics desired for a particular application. For example, Pyrex® is relatively inexpensive and has good thermal characteristics, while quartz has good chemical resistance properties, a low energy dissipation factor, and is generally boron-free. Both Pyrex(® and quartz have relatively low dielectric constants. Ceramics such as barium titanate and bariam titanate have dielectric constants a few orders of magnitude higher than Pyrex® and quartz, as described in more detail below.

Typically, sample tube 40a has a length on the order of tens of cm, a diameter on the order of a few mm, and a wall thickness on the order of half a mm. In a present implementation, sample tube 40a is a standard 5 mm sample tube commonly employed in NMR measurements, having a length of 18 cm (of which about 4 cm contain sample), a diameter of 4.97 mm, and a wall thickness of 0.38 mm.

FIG. 2-B shows a second sample 22b comprising a second sample tube 40b and associated sample tube contents 46b. Sample tube 40b is formed by a single uniform piece of a second sample tube material. The second solvent is different from the first solvent, and in particular it has a different dielectric constant than the first solvent. Similarly, the second sample tube material is different from the first sample tube material of sample tube 40a, and has a different dielectric constant than the first sample tube material.

The first and second solvents and sample tube materials are preferably chosen such that the frequency shifts caused by samples 22a–b in the resonant frequency of the NMR detection circuitry are substantially equal, even if different solvents having significantly different dielectric constants are used in the two samples. If, as in typical applications, the frequency shifts are due primarily to the capacitive (dielectric) properties of the filled sample tubes, the solvents and sample tube materials are chosen such that the effective dielectric constants of samples 22a–b are substantially equal. If the effective dielectric constants of the two samples 22a–b are equal, inserting samples 22a–b into a measurement location within the NMR probe causes the same change in the overall effective capacitance of the NMR detection circuitry. This method of tuning compensation reduces or eliminates the need to perform tuning compensation by altering the properties of the measurement circuitry outside of the samples.

The external dimensions (diameter and length) of sample tubes 40a–b are preferably substantially equal, so that both sample tubes 40a–b fit within the same, unmodified NMR probe with a high filling factor. The interior dimensions of sample tubes 22a–b are also preferably substantially equal, such that sample tubes 22a–b hold essentially the same volume of solvent/sample.

The difference between the dielectric constants of the materials chosen for the two sample tubes 40a–b can be significantly greater than the difference between the dielectric constants of the solvents used in the two sample tubes. The volume of the sample tubes walls is typically lower than the volume of solvent held in each sample tube. As an illustration, the ratio of wall volume to content volume for a standard 5 mm sample tube with the dimensions described above is about ⅓. A relatively large difference in sample tube dielectric constants may be needed to adequately compensate for a smaller difference in solvent dielectric constants.

FIG. 2-C shows a third sample 22c comprising a third sample tube 40c and associated sample tube contents 46c. Sample tube 40c comprises two stacked concentric cylindrical shells or layers 48, 50. Shells 48, 50 are made of different materials. One of the shells 48, 50 may be effectively a coating deposited onto the other shell. An inner shell 50 is attached to the inner surface of an outer shell 48. The inner surface of inner shell 50 makes contact with sample tube contents 46c. Multiple stacked shells made of different materials can be used to tailor the effective capacitance of sample 22c to a desired value, particularly if only a limited choice of materials is available for the components of sample tube 40c. For example, one of the shells may have a dielectric constant one or more orders of magnitude higher than the other shell. In alternative embodiments, three or more stacked shells may be used to form a sample tube.

Sample tubes comprising multiple stacked shells or layers can be used to tailor the magnetic susceptibility properties of different samples, such that different sample tubes and samples have substantially identical effective magnetic susceptibilities. Spectrometer components such as shim coils are usually optimized for given sample magnetic properties.

Using samples having different magnetic properties can lead to relative non-uniformities in the magnetic fields applied to the samples. Such non-uniformities can lead to linewidth broadening for NMR measurements performed on the samples. Appropriate choice of materials and thicknesses for the different shells allow simultaneous tailoring of the dielectric and magnetic susceptibility properties of the sample tubes.

FIG. 2-D illustrates a fourth sample 22d comprising a fourth sample tube 40d and associated sample tube contents 46d. Sample tube 40d comprises a cylindrical shell 52, and a longitudinal, cylindrical rod 54 inserted within cylindrical shell 52. The transverse size of rod 54 is smaller than the transverse inner size of shell 52. In particular, the volume of rod 54 is much smaller than the volume of contents 46d enclosed by shell 52. Preferably, the volume of rod 54 is less than 20%, for example less than 10%, of the volume enclosed by shell 52. Rod 54 can be made of a material having a much higher (e.g. more than a factor of 10 higher) dielectric constant than the dielectric constant of shell 52. Consequently, the effective dielectric constant of sample tube 40d can be significantly higher than the effective dielectric constant of shell 52 alone.

A variety of materials and combinations of materials can be used for sample tubes such as sample tubes 40a–d. Table 2 illustrates the dielectric constants of several materials having different dielectric constants.

TABLE 2

| Material | Dielectric constant |
| --- | --- |
| Polytetrafluoroethylene (PTFE) | 2.1 |
| Quartz | 4.1 |
| Pyrex ® (borosilicate glass) | 5 |
| Sapphire | 10 |
| Barium titanate | 1,200 |
| Lead magnesium niobate | 10,000 |

Different compositions comprising materials such as the ones listed in Table 2 can be used in conjunction with different solvents such as the ones listed in Table 1 to establish sample tube/solvent pairs which generate similar frequency shifts in a given resonant circuit.

The exact frequency shift introduced into a given resonant frequency by a sample depends on the properties of the sample, the geometry of the sample/circuit interface area, and the properties of the resonant circuit outside of the sample. It is preferred that the frequency shifts introduced by corresponding sample tube/solvent pairs be experimentally tested to ensure the frequency shifts have desired values.

Preferably, the frequency shifts introduced by different samples are within a −5 dB bandwidth of the probe and coil employed for measurements. In particular, the frequency shifts are preferably within a −10 dB bandwidth, and ideally within a −15 dB bandwidth of the coil.

In general, a given NMR coil can only accept applied RF energy within a frequency range centered around a frequency corresponding to optimal impedance-matching. As the applied RF energy is shifted away from the optimal impedance-matching frequency, larger fractions of the applied energy are reflected, and do not enter the coil. A −5 dB bandwidth of a probe is the frequency bandwidth within which the logarithmic ratio of reflected RF power to applied RF power is less than or equal to −5 dB. For RF energy applied at a frequency corresponding to 0 dB, no power gets into the probe. At the lowest negative dB value, which corresponds to optimal impedance matching, the maximum amount of applied RF power enters the probe. The fractions of applied RF power entering the probe at −5 dB, −10 dB, and −15 dB are approximately 70%, 90%, and 95%, respectively.

It was empirically observed that a Varian 400 ASW probe, which is representative of presently-available NMR probes, has −5 dB, −10 dB, and −15 dB bandwidths of about 0.8 MHz, 0.4 MHz, and 0.2 MHz, respectively. In general, other NMR probes may have different such bandwidths. In the preferred embodiment, the frequency shifts introduced by any two different samples differ by less than 0.8 MHz, in particular less than 0.4 MHz or 0.2 MHz, even if the frequency shifts introduced by the different solvents alone, with similar or identical sample tubes, would differ by more than 0.8 MHz, 0.4 MHz, or 0.2 MHz, respectively.

It was empirically observed that the frequency shift introduced into an NMR resonant circuit by a cylinder-shaped sample follows roughly the general relation $$\Delta \nu = A\ln(\epsilon_{st}+1) + B\ln(\epsilon_s+1) \quad [2]$$

where $\epsilon_{st}$ is the dielectric constant of the sample tube, $\epsilon_s$ is the dielectric constant of the sample tube contents, and A and B are constants depending on the sample geometry and other resonant circuit properties. Commonly, the dielectric constant of the sample solvents provides a good approximation for the dielectric constant of the sample tube contents. Equation [2] can be used to narrow down the choices of sample tube dielectric materials corresponding to given solvents, by setting the frequency shifts caused by different sample tube/solvent combinations to be equal:

$$\Delta \nu = A\ln(\epsilon_{st1}+1) + B\ln(\epsilon_{s1}+1) = A\ln(\epsilon_{st2}+1) + B\ln(\epsilon_{s2}+1), \quad [3]$$

wherein the indices 1 and 2 refer to first and second sample tube and solvent combinations, respectively.

Figure 3:
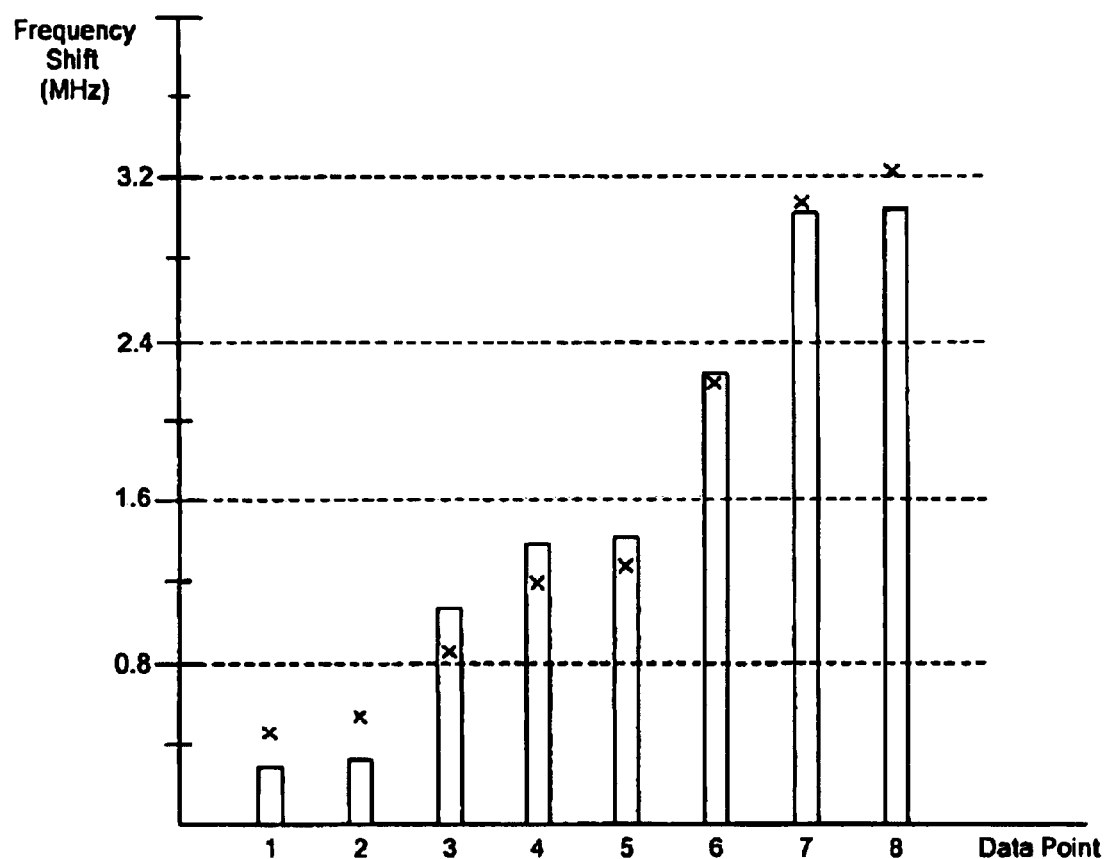
FIG. 3 is a graph illustrating empirically measured frequency-shifts and corresponding computed frequency shifts for several solvent-sample tube pairs, according to the present invention.

FIG. 3 and Table 3 illustrate a set of frequency shifts computed according to Eq. [2] and a set of experimentally-measured frequency shifts corresponding to some of the computed frequency shifts. Table 4 shows an additional set of frequency shifts computed according to Eq. [2]. The illustrated frequency shifts correspond to parameter values of A=0.18 MHz and B=0.62 MHz, determined by least-square curve-fitting performed on the experimental data shown in FIG. 3. The bars in FIG. 3 correspond to the computed values of Table 3, while the crosses in FIG. 3 correspond to the measured values of Table 3. The data shows that eq. [2] provides order-of-magnitude estimates for frequency shifts, and does not necessarily eliminate the need for empirically testing a given sample tube/solvent combination.

TABLE 3

| Sample tube material | Sample tube dielectric constant | Sample tube contents | Sample tube contents dielectric constant | Calculated frequency shift (MHz) | Measured frequency shift (MHz) |
| --- | --- | --- | --- | --- | --- |
| Quartz | 4.1 | Air | 0 | 0.29 | 0.46 |
| Pyrex ® | 5 | Air | 0 | 0.32 | 0.54 |
| Pyrex ® | 5 | Benzene | 2.3 | 1.06 | 0.86 |
| Quartz | 4.1 | Chloroform | 4.8 | 1.38 | 1.19 |
| Pyrex ® | 5 | Chloroform | 4.8 | 1.41 | 1.27 |
| Pyrex ® | 5 | Acetone | 20.7 | 2.23 | 2.19 |
| Quartz | 4.1 | Water | 78 | 3.00 | 3.06 |
| Pyrex ® | 5 | Water | 78 | 3.03 | 3.22 |

TABLE 3-continued

| Sample tube material | Sample tube dielectric constant | Sample tube contents | Sample tube contents dielectric constant | Calculated frequency shift (MHz) | Measured frequency shift (MHz) |
|---|---|---|---|---|---|
| None (air) | 0 | Air | 0 | 0 | 0 |

TABLE 4

| Sample tube material | Sample tube dielectric constant | Sample tube contents | Sample tube contents dielectric constant | Calculated frequency shift (MHz) |
|---|---|---|---|---|
| Pyrex ® | 5 | Acetone | 20.7 | 2.23 |
| Pyrex ® | 5 | Benzene | 2.3 | 1.06 |
| Sapphire | 10 | Benzene | 2.3 | 1.17 |
| Barium Titanate | 1,200 | Benzene | 2.3 | 2.02 |
| Lead Magnesium Niobate | 10,000 | Benzene | 2.3 | 2.4 |
| Pyrex ® | 5 | Water | 78 | 3.03 |

As the data of Tables 3 and 4 illustrate, for a given difference in solvent dielectric constants, a larger difference in sample tube effective dielectric constants may be required in order to provide a desired level of tuning compensation. For example, a sample tube comprising a ceramic having a high dielectric constant, such as barium titanate, can be used with a benzene solvent to yield a frequency shift substantially equal to the frequency shift introduced by a pyrex sample tube containing acetone. In order to achieve desired levels of tuning compensation, depending on the application and solvents employed, sample tubes having effective dielectric constants larger than 20 or 100 may be used in conjunction with conventional sample tubes having effective dielectric constants of less than 10.

The data above show that tuning compensation through appropriate choice of sample tubes can be achieved to within about 0.8 MHz or 0.4 MHz, even for solvents having significantly different dielectric constants. For example, the frequency shifts introduced by samples comprising benzene in a barium titanate sample tube and acetone in a Pyrex® sample tube differ by about 0.2 MHz, which is significantly less than the −5 dB and −10 dB bandwidths of typical NMR probes. Other polar and/or apolar solvents can be used with various sample tubes as illustrated in FIGS. 2-A through 2-D to achieve desired frequency shift differences.

Figure 4:
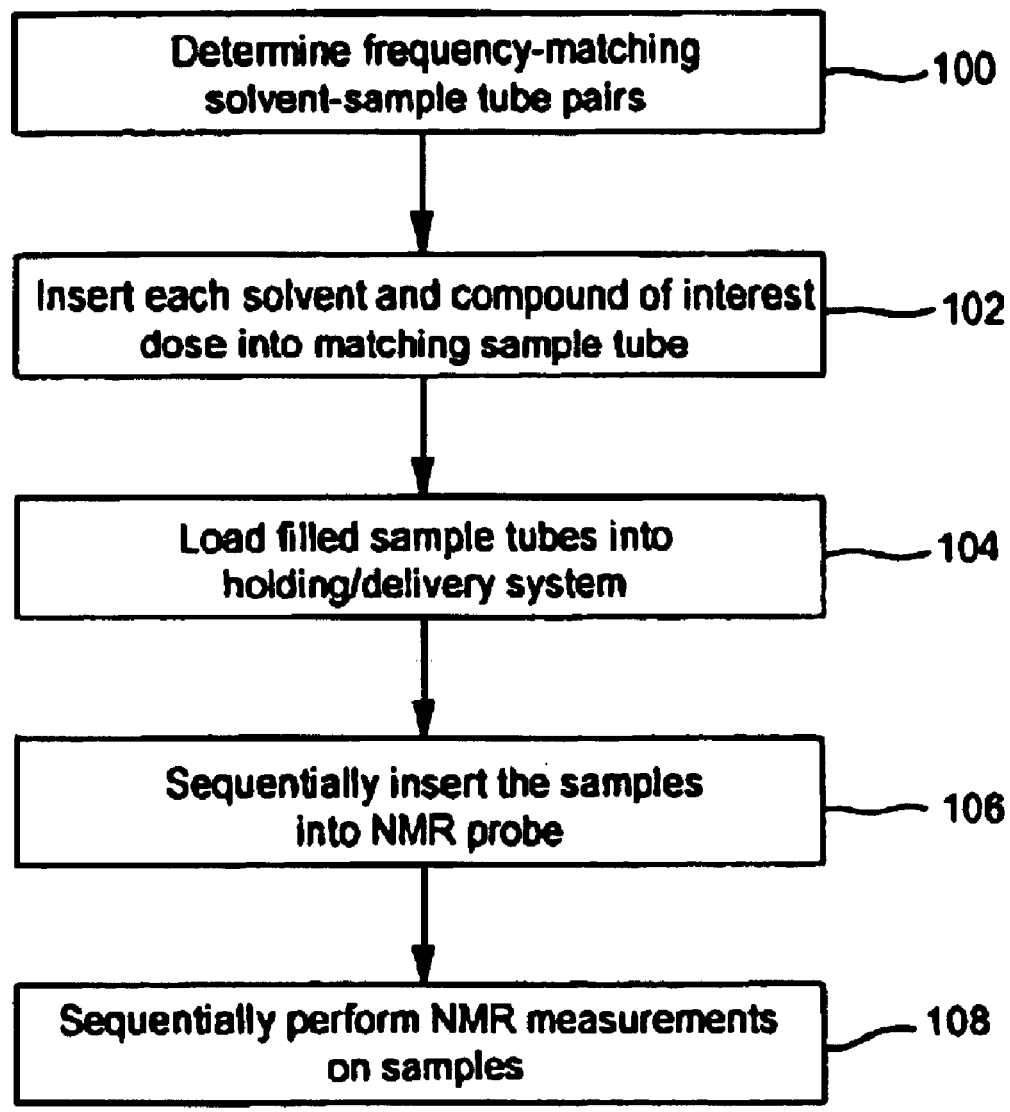
FIG. 4 is a flowchart illustrating the steps of a preferred method of performing tuning-compensated NMR measurements according to the present invention.

FIG. 4 is a flowchart illustrating the steps of an NMR analysis method according to one embodiment of the present invention. In a first step 100, suitable sample tube/solvent pairs are selected so as to achieve a desired level of tuning compensation. Selecting suitable sample tube/solvent pairs preferably includes determining the frequency shift introduced in the NMR apparatus of interest by each sample, and determining whether the different frequency shifts meet a predetermined condition. Determining the frequency shifts is preferably done by performing actual measurements on the samples, or by looking up previously measured values. The samples (sample tube/solvent combinations) are selected for measurements if the determined frequency shifts meet some predetermined condition. The condition can be, for example, that the difference between the frequency shifts be less than or equal to some predetermined value, such as the −5 dB, −10 dB, or −15 dB bandwidth of the NMR probe of interest.

In a subsequent step 102, each solvent and compound of interest is inserted into its corresponding sample tube. The filled sample tubes are then inserted into a sample holder, as illustrated by the step 104. The samples are sequentially transferred, one by one, from the sample holder into the measurement area of the NMR probe, as shown at 106. Desired NMR measurements are then performed on each sample present within the NMR probe, as illustrated at 108. After NMR measurements are performed on one sample, that sample is removed from the NMR probe and a new sample is transferred from the holding/delivery system into the NMR probe.

It will be clear to one skilled in the art that the above embodiments may be altered in many ways without departing from the scope of the invention. Accordingly, the scope of the invention should be determined by the following claims and their legal equivalents.

What is claimed is:

1. A method of selecting sample tube-solvent pairs for performing nuclear magnetic resonance measurements, comprising:

determining a first frequency shift introduced by a first sample into a resonant circuit of a nuclear magnetic resonance spectrometer, the first sample including a first sample tube containing a first sample solvent and a first compound of interest, wherein the first solvent has a first solvent dielectric constant and the first sample tube has a first effective sample tube dielectric constant;

determining a second frequency shift introduced by a second sample into the resonant circuit of the nuclear magnetic resonance spectrometer, the second sample including a second sample tube containing a second sample solvent and a second compound of interest, wherein the second solvent has a second solvent dielectric constant different from the first solvent dielectric constant, and the second sample tube has a second effective sample tube dielectric constant different from the first sample tube dielectric constant; and selecting the first sample and the second sample for performing nuclear magnetic resonance measurements on the first compound of interest and the second compound of interest when the first frequency shift and the second frequency shift have a predetermined relationship.

2. The method of claim 1, wherein the first sample and the second sample are selected when a difference between the first frequency shift and the second frequency shift is less than or equal to a predetermined value.

3. The method of claim 2 wherein the predetermined value is less than or equal to a −5 dB bandwidth of a nuclear magnetic resonance probe to be used for the measurements.

4. The method of claim 2 wherein the predetermined value is less than or equal to a −10 dB bandwidth of a nuclear magnetic resonance probe to be used for the measurements.

5. The method of claim 2, wherein the predetermined value is less than or equal to 0.8 MHz.

6. The method of claim 2, wherein the predetermined value is less than or equal to 0.4 MHz.

7. The method of claim 6, wherein a magnitude of a difference between the first solvent dielectric constant and the second solvent dielectric constant is higher than ten.

8. The method of claim 2, wherein the predetermined value is less than or equal to 0.2 MHz.

9. The method of claim 1, wherein the first sample tube dielectric constant is higher than or equal to 20.

10. The method of claim 9, wherein the second sample tube dielectric constant is lower than or equal to 10.

11. The method of claim 10, wherein the first solvent is apolar, and the second solvent is polar.

12. The method of claim 9, wherein the second sample tube is formed from a material selected from quartz, sapphire, borosilicate glass, and plastic.

13. The method of claim 1, wherein the first sample tube dielectric constant is higher than or equal to 100.

14. The method of claim 1, wherein the first sample tube comprises a ceramic.

15. The method of claim 1, wherein the first sample tube is formed by a monolithic piece.

16. The method of claim 1, wherein the first sample tube comprises two layers of materials having different dielectric constants.

17. The method of claim 16, wherein one of the two layers is a coating disposed on another of the two layers.

18. The method of claim 1, wherein the first sample tube comprises an outer shell and a rod positioned within the outer shell.

19. The method of claim 1, further comprising sequentially performing nuclear magnetic resonance measurements on the first sample and the second sample using the resonant circuit.

20. The method of claim 19 wherein, between a measurement performed on the first sample and a measurement performed on the second sample, the resonant circuit is not externally retuned to compensate for the difference between the first frequency shift and the second frequency shift.

21. The method of claim 19, wherein the first frequency shift and the second frequency shift are substantially equal.

22. The method of claim 1, wherein determining the first frequency shift and the second frequency shift comprises looking up pre-measured values of the first frequency shift and the second frequency shift.

23. A method of selecting sample tubes for performing nuclear magnetic resonance measurements, comprising:
a) determining a first frequency shift introduced in a resonant frequency of a resonant circuit of a nuclear magnetic resonance spectrometer by a first sample comprising a first sample tube containing a first sample solvent;
b) determining a second frequency shift introduced in the resonant frequency of the resonant circuit by a second sample comprising a second sample tube containing a second sample solvent, wherein the first sample solvent is different from the second sample solvent and the first sample tube has a different effective dielectric constant from the second sample tube; and
c) when the first frequency shift is substantially equal to the second frequency shift, selecting the first sample and the second sample for sequentially performing nuclear magnetic resonance measurements using the resonant circuit on a first compound of interest contained in the first solvent in the first sample tube and on a second compound of interest contained in the second solvent in the second sample tube.

24. The method of claim 23, further comprising a step of selecting the second sample tube such that $$A\ln(\epsilon_{st1}+1)+B\ln(\epsilon_{s1}+1)=A\ln(\epsilon_{st2}+1)+B\ln(\epsilon_{s2}+1),$$

wherein A and B are numeric constants, $\epsilon_{st1}$ is a dielectric constant of the first sample tube, $\epsilon_{st2}$ is a dielectric constant of the second sample tube, $\epsilon_{s1}$ is a dielectric constant of the first solvent, and $\epsilon_{s2}$ is a dielectric constant of the second solvent.

25. A method of performing nuclear magnetic resonance measurements, comprising:

a) loading a first sample into a nuclear magnetic resonance probe of a nuclear magnetic resonance spectrometer, the first sample including a first sample tube containing a first sample solvent and a first compound of interest, the spectrometer including a resonant circuit for performing nuclear magnetic resonance measurements on samples, wherein
the first solvent has a first solvent dielectric constant and the first sample tube has a first sample tube dielectric constant, and
the first sample causes a first frequency shift in the resonant frequency of the resonant circuit upon loading into the probe;
b) employing the resonant circuit to perform a first nuclear magnetic resonance measurement on the first compound of interest contained in the first sample tube;
c) after the first nuclear magnetic resonance measurement is performed, loading a second sample including a second sample tube containing a second sample solvent and a second compound of interest into the nuclear magnetic resonance probe, wherein
the second solvent has a second solvent dielectric constant different from the first solvent dielectric constant,
the second sample tube has a second sample tube dielectric constant different from the first sample tube dielectric constant,
the second sample causes a second frequency shift in the resonant frequency of the resonant circuit upon loading into the probe; and
d) employing the resonant circuit to perform a second nuclear magnetic resonance measurement on the compound of interest contained in the second sample tube;
wherein the second frequency shift is substantially equal to the first frequency shift,
whereby the resonant frequency of the resonant circuit need not be externally retuned between the first nuclear magnetic resonance measurement and the second nuclear magnetic resonance measurement.

26. The method of claim 25, wherein the first sample tube dielectric constant is higher than or equal to 20.

27. The method of claim 26, wherein the second sample tube dielectric constant is lower than or equal to 10.

28. The method of claim 27, wherein the first solvent is apolar, and the second solvent is polar.

29. The method of claim 26, wherein the second sample tube is formed from a material selected from quartz, sapphire, borosilicate glass, and plastic.

30. The method of claim 25, wherein the first sample tube dielectric constant is higher than or equal to 100.

31. The method of claim 25, wherein the first sample tube comprises a ceramic.

32. The method of claim 25, wherein a magnitude of a difference between the first solvent dielectric constant and the second solvent dielectric constant is higher than or equal to 10, and a magnitude of a difference between the first sample tube dielectric constant and the second sample tube dielectric constant is higher than or equal to 10.

33. The method of claim 25, wherein the first solvent is water.

34. The method of claim 33, wherein the second solvent is selected from benzene and chloroform.

35. The method of claim 25, wherein the first sample tube is formed by a monolithic piece.

36. The method of claim 25, wherein the first sample tube comprises two layers of materials having different dielectric constants.

37. The method of claim 25, wherein the first sample tube comprises an outer shell and a rod positioned within the outer shell.

38. The method of claim 25, further comprising:
   a) loading a batch of samples into a sample holder, the batch of samples including the first sample and the second sample; and
   b) sequentially transferring the batch of samples from the sample holder to the probe.

39. A method of performing nuclear magnetic resonance measurements, comprising:
   a) performing a first nuclear magnetic resonance measurement on a first sample, the first sample comprising a first sample tube containing first sample contents including a first sample solvent and a first compound of interest; and
   b) performing a second nuclear magnetic resonance measurement on a second sample, the second sample comprising a second sample tube containing second sample contents including a second sample solvent and a second compound of interest; wherein
      an effective dielectric constant of the first sample tube is lower than an effective dielectric constant of the second sample tube,
      a dielectric constant of the first sample contents is higher than a dielectric constant of the second sample contents,
      whereby a difference in dielectric properties between the first sample tube and the second tube compensates at least partially for a difference in dielectric properties between the first sample contents and the second sample contents.

40. The method of claim 39, wherein the effective dielectric constant of the second sample tube is higher than or equal to 20.

41. A method of performing nuclear magnetic resonance measurements, comprising:
   a) loading a first solvent and a first set of compounds of interest into a corresponding plurality of substantially identical first sample tubes, wherein each first sample tube containing the first solvent introduces a first frequency shift into a resonant frequency of a resonant circuit of a nuclear magnetic resonance spectrometer; and
   b) loading a second solvent and a second set of compounds of interest into a corresponding plurality of substantially identical second sample tubes different from the first sample tubes, the second solvent being different from the first solvent, wherein each second sample tube containing the second solvent introduces a second frequency shift into the resonant frequency of the resonant circuit, and wherein the second frequency shift is substantially equal to the first frequency shift;
   c) employing the resonant circuit to sequentially perform nuclear magnetic resonant measurements on the set of first compounds of interest loaded into the plurality of first sample tubes containing the first solvent, and on the set of second compounds of interest loaded into the plurality of second sample tubes containing the second solvent.

42. A method of performing nuclear magnetic resonance measurements, comprising:
   a) loading a first sample into a nuclear magnetic resonance probe of a nuclear magnetic resonance spectrometer, the first sample including a first sample tube containing a first sample solvent and a first compound of interest, the spectrometer including a resonant circuit for performing nuclear magnetic resonance measurements on samples, wherein
      the first solvent has a first solvent dielectric constant and the first sample tube has a first sample tube dielectric constant, and
      the first sample causes a first frequency shift in the resonant frequency of the resonant circuit upon loading into the probe;
   b) employing the resonant circuit to perform a first nuclear magnetic resonance measurement on the first compound of interest contained in the first sample tube;
   c) after the first nuclear magnetic resonance measurement is performed, loading a second sample including a second sample tube containing a second sample solvent and a second compound of interest into the nuclear magnetic resonance probe, wherein
      the second solvent has a second solvent dielectric constant different from the first solvent dielectric constant,
      the second sample tube has a second sample tube dielectric constant different from the first sample tube dielectric constant,
      the second sample causes a second frequency shift in the resonant frequency of the resonant circuit upon loading into the probe; and
   d) employing the resonant circuit to perform a second nuclear magnetic resonance measurement on the compound of interest contained in the second sample tube;
   wherein a magnitude of a difference between the second frequency shift and the first frequency shift is lower than a −5 dB bandwidth of the probe.

43. The method of claim 42, wherein the magnitude of the difference between the second frequency shift and the first frequency shift is lower than a −10 dB bandwidth of the probe.

44. The method of claim 42, wherein a magnitude of a difference between the first solvent dielectric constant and the second solvent dielectric constant is higher than ten.

45. A method of performing nuclear magnetic resonance measurements, comprising:
   a) loading a first sample comprising a first sample tube containing a first solvent and a first compound of interest into a nuclear magnetic resonance probe of a nuclear magnetic resonance spectrometer, wherein the first solvent has a first solvent dielectric constant and the first sample tube has a first sample tube dielectric constant;
   b) employing the probe and spectrometer to perform a first nuclear magnetic resonance measurement on the first compound of interest contained in the first sample tube;
   c) after the first nuclear magnetic resonance measurement is performed, loading a second sample comprising a second sample tube containing a second solvent and a second compound of interest into the nuclear magnetic resonance probe, wherein:
      the second solvent has a second solvent dielectric constant different from the first solvent dielectric constant,
      the second sample tube has a second sample tube dielectric constant different from the first sample tube dielectric constant, and
      a difference between the first sample tube dielectric constant and the second sample tube dielectric constant substantially offsets a difference between the first solvent dielectric constant and the second solvent dielectric constant; and d) employing the probe and spectrometer to perform a second nuclear magnetic resonance measurement on the second compound of interest contained in the second sample tube.

46. A method of performing nuclear magnetic resonance measurements, comprising:

a) loading a first sample comprising a first sample tube containing a first solvent and a first compound of interest into a nuclear magnetic resonance probe of a nuclear magnetic resonance spectrometer, wherein the first sample has a first effective dielectric constant;

b) performing a first nuclear magnetic resonance measurement on the first sample;

c) after the first nuclear magnetic resonance measurement is performed, loading a second sample comprising a second sample tube containing a second solvent and a second compound of interest into the nuclear magnetic resonance probe, wherein the second sample has a second effective dielectric constant, and wherein:

the first solvent has a different dielectric constant from the second solvent, the first sample tube has a different dielectric constant from the second sample tube, and the first effective dielectric constant is substantially equal to the second effective dielectric constant; and d) performing a second nuclear magnetic resonance measurement on the second sample.

47. A nuclear magnetic resonance apparatus comprising:

a) a nuclear magnetic resonance spectrometer including a resonant circuit which sequentially performs nuclear magnetic resonance measurements on samples inserted in a measurement location of the spectrometer; and b) a sample holding and loading system which stores and loads into the measurement location a plurality of samples, the plurality of samples comprising a plurality of first samples comprising a plurality of sample tubes containing a first solvent and a corresponding first set of compounds of interest, wherein each first sample introduces a first frequency shift into a resonant frequency of the resonant circuit, and a plurality of second samples comprising a plurality of second sample tubes containing a second solvent and a corresponding second set of compounds of interest, wherein each of the second sample tubes has a different dielectric constant from each of the first sample tubes, the second solvent has a different dielectric constant from the first solvent, each second sample introduces a second frequency shift into the resonant frequency of the resonant circuit, and the second frequency shift is substantially equal to the first frequency shift.

48. A sample holding apparatus which stores a plurality of samples and permits sequential loading into a nuclear magnetic resonance spectrometer, comprising:

a) a sample holder for holding the plurality of samples;

b) a plurality of first samples situated in the sample holder, comprising a plurality of sample tubes containing a first solvent and a corresponding first set of compounds of interest; and c) a plurality of second samples situated in the sample holder, comprising a plurality of second sample tubes containing a second solvent and a corresponding second set of compounds of interest, wherein each of the second sample tubes has a different dielectric constant from each of the first sample tubes, the second solvent has a different dielectric constant from the first solvent, and the plurality of second samples and the plurality of first samples have substantially equal effective dielectric constants.

* * * * *